United States Patent
Ali

(10) Patent No.: US 7,026,968 B1
(45) Date of Patent: Apr. 11, 2006

(54) ANALOG-TO-DIGITAL CONVERTER AND METHOD WITH SWITCHED CAPACITORS FOR REDUCED MEMORY EFFECT

(75) Inventor: Ahmed Mohamed Abdelatty Ali, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 17 days.

(21) Appl. No.: 10/980,473

(22) Filed: Nov. 2, 2004

Related U.S. Application Data

(62) Division of application No. 10/793,563, filed on Mar. 3, 2004, now Pat. No. 6,861,969.

(51) Int. Cl.
*H03M 1/10* (2006.01)

(52) U.S. Cl. ................................ 341/120; 341/172
(58) Field of Classification Search ............. 341/118, 341/120, 122, 131, 155, 161, 172
See application file for complete search history.

(56) References Cited

U.S. PATENT DOCUMENTS

| | | | | |
|---|---|---|---|---|
| 5,248,974 A | | 9/1993 | Fattaruso et al. .......... 341/172 |
| 5,861,828 A | * | 1/1999 | Opris ....................... 341/120 |
| 6,184,809 B1 | * | 2/2001 | Yu .......................... 341/120 |
| 6,337,651 B1 | * | 1/2002 | Chiang ..................... 341/161 |
| 6,600,440 B1 | * | 7/2003 | Sakurai ..................... 341/172 |
| 6,606,042 B1 | * | 8/2003 | Sonkusale et al. ........... 341/120 |
| 6,617,992 B1 | * | 9/2003 | Sakurai ..................... 341/161 |
| 6,784,824 B1 | * | 8/2004 | Quinn ....................... 341/172 |

OTHER PUBLICATIONS

Zanachi, Alfio, et al., "Impact of Dielectic Relaxation on a 14b Pipeline ADC in 3V SiGe BiCMOS", Feb. 12, 2003 IEEE International Solid-State Circuits Conference, Session 18—Nyquist A/D Converters.

* cited by examiner

*Primary Examiner*—Linh V. Nguyen
(74) *Attorney, Agent, or Firm*—Koppel, Jacobs, Patrick & Heybl

(57) ABSTRACT

Methods and structures are provided that reduce conversion errors in pipelined analog-to-digital converters which are induced in one converter cycle by component memory of signals in one or more preceding converter cycles. The methods and structures include the use of digital filters that provide a digital representation of the residue of a preceding converter cycle, multiply this representation by an appropriate memory parameter, and sum the product with the digital representation of the residue of a current converter cycle to thereby reduce the memory effect. The methods and structures also form capacitors of switched-capacitor converter structures with sub-capacitors that are reconfigured (e.g., reversed or alternated between differential sides of differential amplifiers) in different converter cycles.

15 Claims, 10 Drawing Sheets

ANALOG-TO-DIGITAL CONVERTER AND METHOD WITH SWITCHED CAPACITORS FOR REDUCED MEMORY EFFECT

RELATED APPLICATION

This Application is a divisional of Ser. No. 10/793,563, filed Mar. 3, 2004 is now a U.S. Pat. No. 6,861,969.

BACKGROUND OF THE INVENTION

1. Field of the Invention

The present invention relates generally to pipelined analog-to-digital converters.

2. Description of the Related Art

A variety of modern electronic systems (e.g., scanners, camcorders, communication modems, medical image processors and high-definition television) require high-speed signal conditioning which has been effectively provided with pipelined analog-to-digital converters (ADCs) whose multiple converter stages provide conversion speeds that typically exceed those of other converter structures.

In pipelined operation, it is intended that stage amplifiers provide amplifier output signals that correspond only to stage input signals. For example, an important class of pipelined ADCs is realized with converter stages that each use a switched-capacitor structure to process a respective input data signal and generate a succeeding input data signal for a succeeding converter stage.

It has been found that gain and offset errors in these switched-capacitor structures introduce nonlinearities into the pipelined converter's transfer function and various methods and structures have been proposed to reduce these errors. There remain other errors, however, which continue to degrade pipelined converter performance and sources and solutions for these errors has often not been identified.

BRIEF SUMMARY OF THE INVENTION

The present invention is directed to methods and structures that reduce memory effect conversion errors in pipelined ADC systems.

The novel features of the invention are set forth with particularity in the appended claims. The invention will be best understood from the following description when read in conjunction with the accompanying drawings.

DETAILED DESCRIPTION OF THE INVENTION

Pipelined ADC systems of the present invention recognize that memory effect of system components can induce nonlinearities into system converter stages. In particular, conversion errors are induced in one converter cycle because of component memory of the signals in one or more preceding converter cycles. Systems of the invention recognize particular memory sources and provide methods and structures in the following description that reduce their induced conversion errors.

Figure 1:
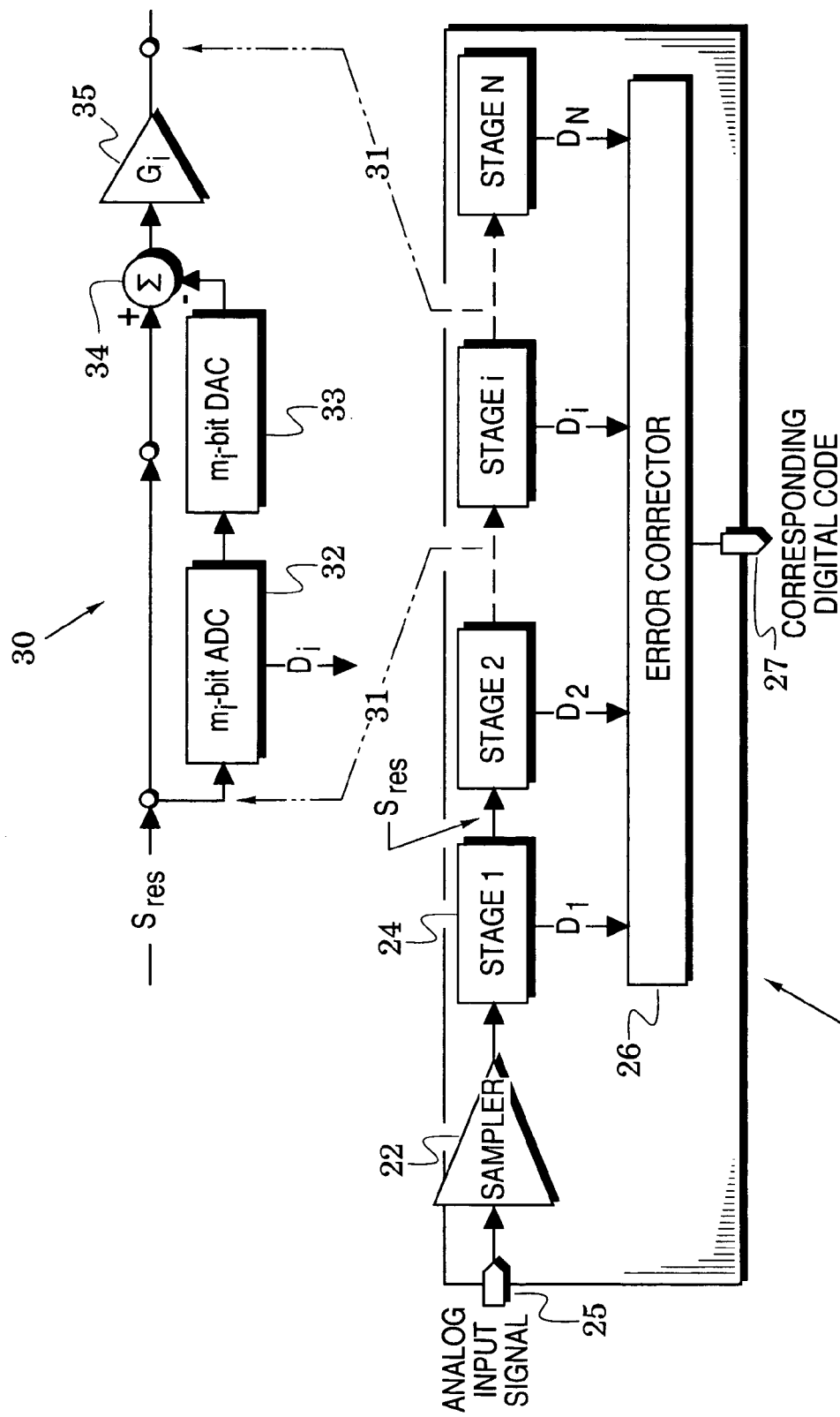
FIG. 1 is a block diagram of a pipelined ADC system.

The pipelined ADC 20 of FIG. 1 includes a sampler 22 and N converter stages 24 that are coupled in a successive pipelined arrangement. The sampler provides samples of an analog input signal received at an input port 25 which converter stage 1 then converts to a corresponding digital word $D_1$. Converter stage 1 also provides a residue signal $S_{res}$ to the succeeding converter stage 2. In succession, each of the converter stages 2-N converts its respective residue signal to a respective digital word (e.g., $D_i$ for stage i) and provides a residue signal to the succeeding stage. However, the final stage N differs in that it converts its respective residue signal to a respective digital word $D_N$ but has no need to provide a residue signal.

All converter stages, therefore, simultaneously convert respective analog input signals to corresponding digital words but at any given moment, each converter stage is processing the residue of a different one of the analog samples provided by the sampler 22. That is, analog sample is successively converted in the converter stages of the system 20. The digital words that correspond to a respective analog sample are then temporally aligned, corrected and combined in an error corrector 26 to thereby provide a corresponding digital code at an output port 27 that corresponds to the analog sample.

An exemplary converter stage 30 is indicated by extension lines 31 to show that it includes an ADC 32, a digital-to-analog converter (DAC) 33, an adder 34 and an amplifier 35 with a gain G. The ADC 32 converts this stage's residue signal into a corresponding digital word $D_i$ and the DAC 31 converts this digital word to a corresponding analog signal which is provided to the adder 34 where it is subtracted from this stage's residue signal to provide a residue signal $S_{res}$ for the succeeding stage. The residue signal is preferably gained up in the amplifier 35 before it is provided to the successive stage.

Although converter stages of the invention are generally directed to the conversion of any number of bits, FIG. 2 illustrates an exemplary 1.5 bit stage 40 which includes a pair of comparators 42, an amplifier 44, first and second capacitors $C_1$ and $C_2$ and a DAC 46. The first and second capacitors are preferably matched (i.e., their capacitances are equal) and are coupled between the comparators and the amplifier.

In each converter cycle of the converter stage 40, the comparators 42 provide the stage's digital word $D_i$ in response to the residue signal $S_{res}$ of the preceding converter stage and the DAC 46 provides a decision signal DVref in response to the digital word $D_i$. In response to the preceding residue signal and the decision signal, the first and second capacitors and the associated amplifier then provide a residue signal $S_{res}$ to the succeeding stage.

Figures 2A, 2B:
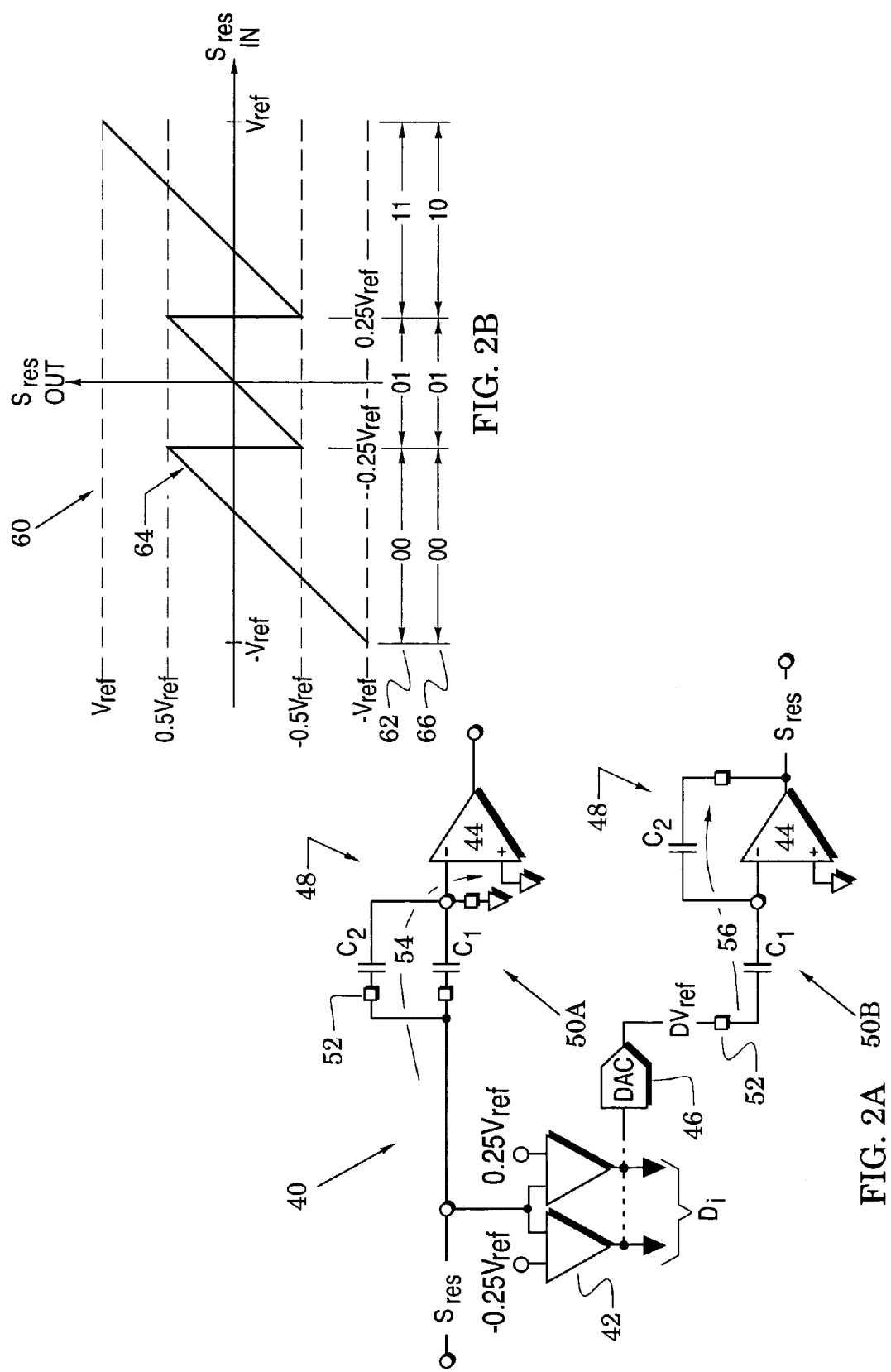
FIG. 2A is a schematic diagram that illustrates operational phases of an exemplary switched-capacitor structure in converter stages of the system of FIG. 1.
FIG. 2B is a graph of a residue signal that is generated by the structure of FIG. 2A.

Each converter cycle includes first and second operational phases and, accordingly, FIG. 2A shows the first and second capacitors $C_1$ and $C_2$ and the amplifier 44 arranged in a first operational phase 50A and the first and second capacitors $C_1$ and $C_2$, the amplifier 44 and the DAC 46 arranged in a second operational phase 50B. The phases 50A and 50B are generally realized with a switch system and a switch system embodiment is indicated in FIG. 2A with the aid of small squares 52 which each represent a closed switch wherein phase 50A is realized with three closed switches 52 and phase 50B is realized with two closed switches 52. In a succeeding phase, each of these switches is open. The switches, first and second capacitors, and amplifier form a unit 48 which is typically referred to as a switched-capacitor multiplying DAC (MDAC).

The two comparators 42 are respectively biased to compare the input residue signal to $-0.25V_{ref}$ and $+0.25V_{ref}$ wherein $V_{ref}$ is a reference voltage that represents the converter stage's full scale input as shown in the graph 60 of FIG. 2B. Accordingly, the stage's digital word $D_i$ is shown in FIG. 2B (in an upper row 62) to be 00 when the input residue signal is below $-0.25V_{ref}$, 01 when it is between $-0.25V_{ref}$ and $+0.25V_{ref}$ and 11 when it is above $+0.25V_{ref}$. At the same time, the DAC 46 causes the decision signal $DV_{ref}$ to be $+V_{ref}$ when the input residue signal is below $-0.25V_{ref}$, zero when it is between $-0.25V_{ref}$ and $+0.25V_{ref}$ and $+V_{ref}$ when it is above $+0.25V_{ref}$ (i.e., D in the decision signal DVref is correspondingly $-1$, 0 and $+1$).

In the first operational phase 50A, the first and second capacitors $C_1$ and $C_2$ receive an electrical charge 54 from the preceding residue signal. In the second operational phase 50B, an electrical charge 56 is transferred from the first capacitor $C_1$ to the second capacitor $C_2$. Because the capacitors have equal capacitance, the original electrical charge of the second capacitor is doubled so that the gain of the MDAC 48 is two.

As shown in the transfer function 64 of FIG. 2B, the output residue signal thus transits between $-0.5V_{ref}$ and $+0.5V_{ref}$ for input residue signals between $-0.25V_{ref}$ and $+0.25V_{ref}$. The decision signal $DV_{ref}$ shifts the transfer function 64 upward by $V_{ref}$ for input residue signals below $-0.25V_{ref}$ and downward by $V_{ref}$ for input residue signals above $-0.25V_{ref}$.

Comparators inevitably include some offset error so that their decision may be in error for input signals close to their reference signal and this error limits the resolution of the comparator's ADC. The 1.5 bit converter stage 40 of FIG. 2A provides redundancy which causes the ADC to be less susceptible to this comparator offset error and which is utilized in the error corrector 26 of FIG. 1 to provide the correct output digital code at the output port 27.

Figure 2C:
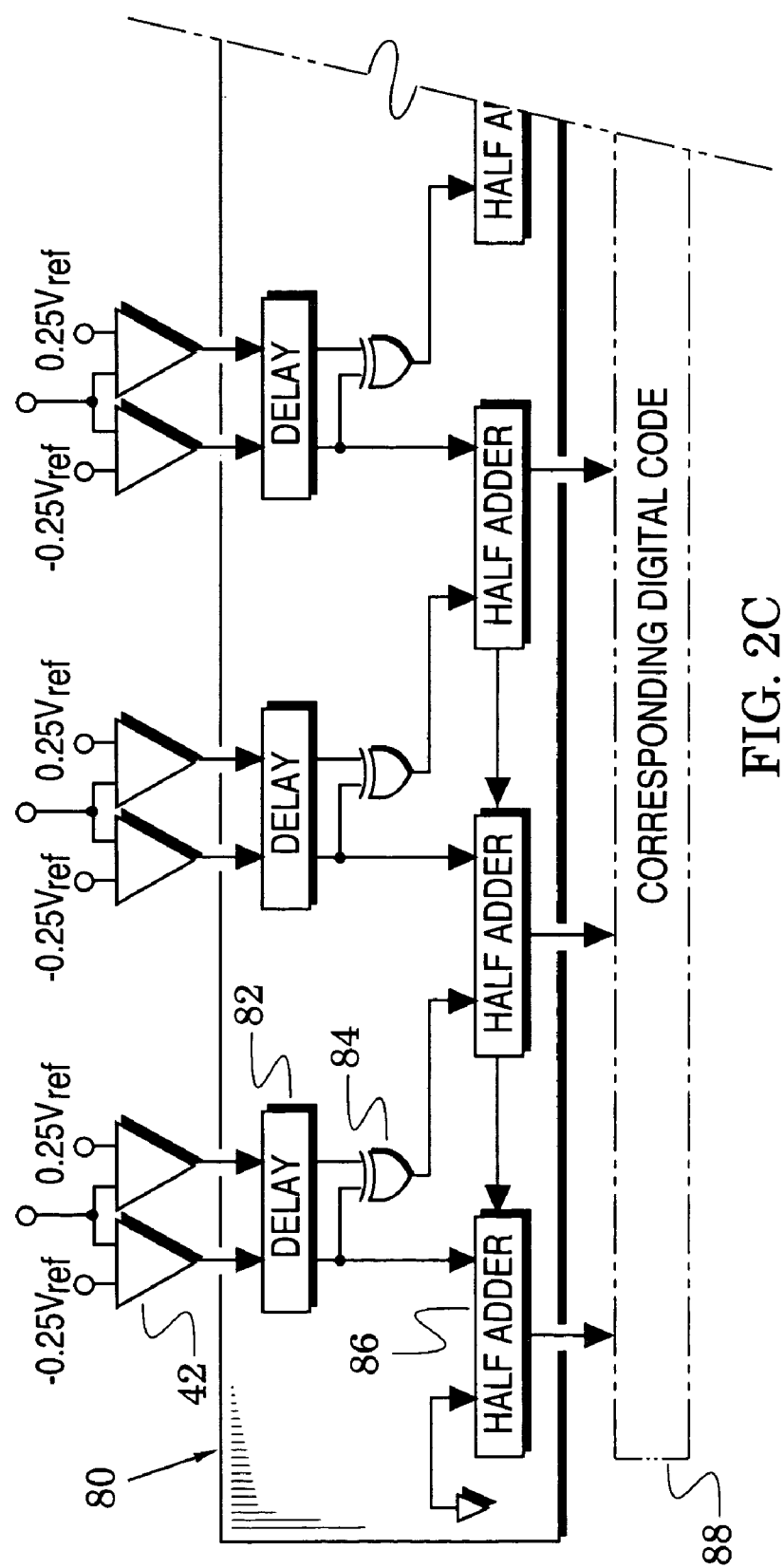
FIG. 2C is a schematic diagram that illustrates an embodiment of an error corrector in the system of FIG. 1.

For example, FIG. 2C illustrates an exemplary error corrector 80 which includes, for each of the converter stages 24 of FIG. 1, a delay 82, an exclusive OR gate 84 and an associated half adder 86. Each set of these elements receives the digital word of a corresponding pair of the comparators 42 of FIG. 2A.

In operation, the delays 82 are of different length so that they temporally align each stage's output with that of a succeeding stage so that all stages contribute to the conversion of each analog input signal that is provided by the sampler 22 of FIG. 1. That is, the delay 82 assigned to each converter stage exceeds the delay 82 assigned to a succeeding stage by the signal delay through each of the converter stages. The exclusive OR gate 84 then converts its stage's digital word $D_i$ (shown in the upper row 66 of FIG. 2B) to be 00 when the input residue signal is below $-0.25V_{ref}$, 01 when it is between $-0.25V_{ref}$ and $+0.25V_{ref}$ and 10 when it is above $+0.25V_{ref}$ as shown in the lower row 64 of FIG. 2B. Thus, the most significant bit remains the same but the least significant bit is altered.

Finally, the half adders 86 sum the least significant bit of each stage with the most significant bit of the succeeding stage and a carry-out bit from the stage that succeeds the succeeding stage. The error corrector 80 thus receives digital words from converter stages such as the stage 40 of FIG. 2A and, in response, provides the digital code 88 that corresponds to the signal originally provided by the sampler 22 of FIG. 1.

Although redundant converter stages such as the 1.5 bit converter stage 40 of FIG. 2A and error correctors such as the error corrector 80 of FIG. 2C reduce conversion errors (due, for example, to ADC offset errors), it has been found that they do not reduce conversion errors caused by memory effect which is a phenomenon in which the output of a converter stage's MDAC (e.g., the MDAC 48 of FIG. 2A) is not solely determined by its current input signal but also by a past output signal even by a past input signal.

It has been found that a major memory effect contributor is the dielectric relaxation of MDAC capacitors (e.g., the first and second capacitors $C_1$ and $C_2$ of FIG. 2A) which generate a relaxation recovery voltage that is a function of the capacitors' material constant κ. For example, silicon nitride capacitors that are often used in radio frequency (RF) circuits have a large material constant κ on the order of 3000 parts per million (ppm) and can cause integral nonlinearity (INL) jumps of 8 least-significant bits (LSBs) in 14-bit pipelined ADCs. Although high-quality Low Pressure Chemical Vapor Deposition (LPCVD) oxide capacitors typically have a much reduced material constant κ on the order of 300 ppm, their relaxation recovery voltage still induces errors in high resolution pipelined ADCs (e.g., resolutions exceeding 14 bits).

Incomplete resetting of stage amplifiers (e.g., amplifier 44 in FIG. 2A) can also be a memory effect contributor. This contribution increases in pipelined ADCs that operate at high speeds and in pipelined ADCs that do not reset in each conversion cycle because they are also active in the cycle's idle phase (second operational phase 50B of FIG. 2A) to realize other converter activities (e.g., to process a calibration signal).

Figure 3A:
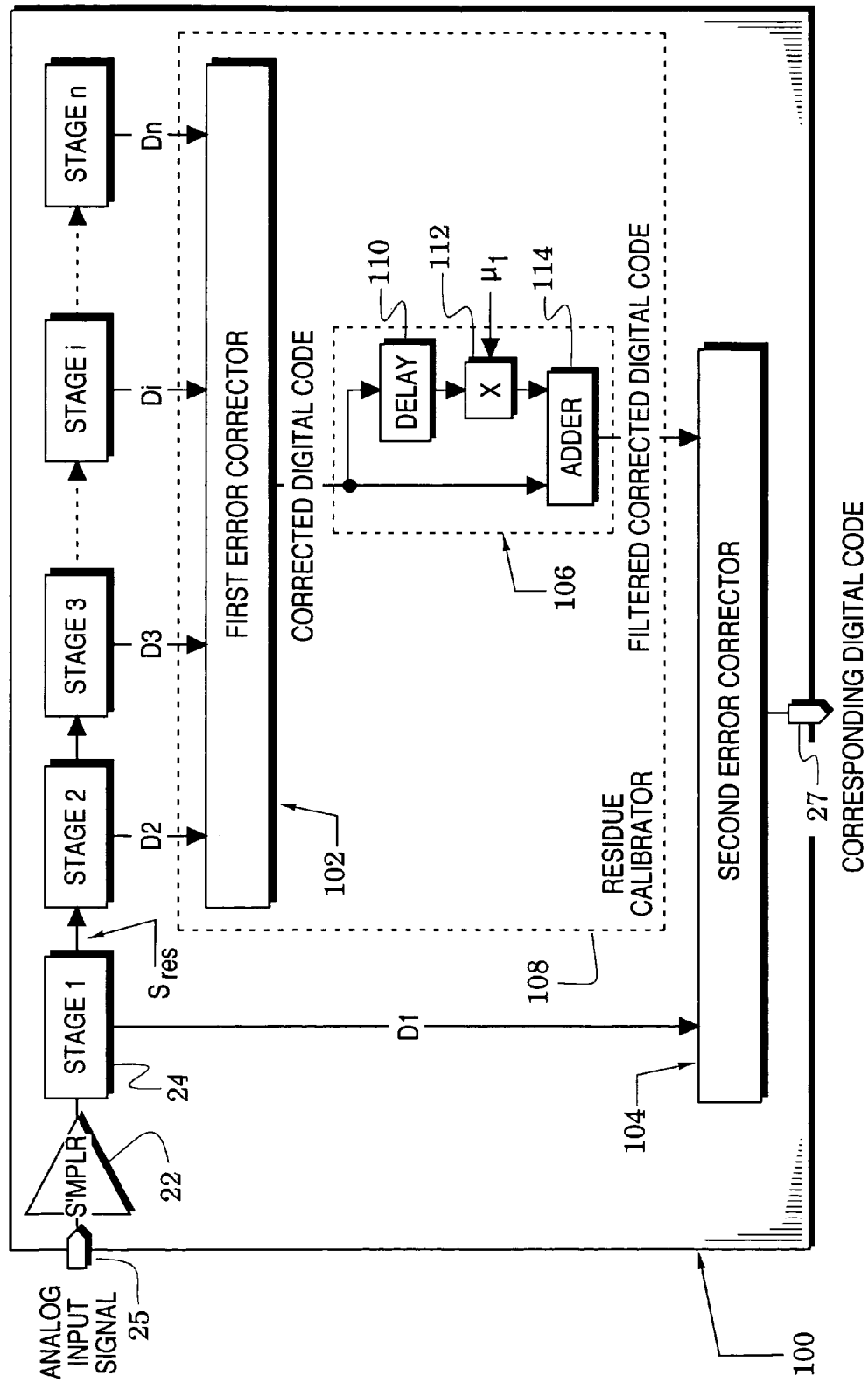
FIGS. 3A and 3B are block diagrams of pipelined ADC system embodiments of the present invention that reduce memory effects induced by a preceding output signal of a converter stage.

Although a variety of techniques have been developed (e.g., capacitor shuffling) to reduce errors caused by imperfect ADC components (e.g., capacitor mismatch and finite amplifier gain), these techniques fail to reduce errors caused by memory effect. FIG. 3A, however, illustrates a pipelined ADC 100 of the present invention that reduces memory effects. The ADC includes the sampler 22 (abbreviated as s'mplr because of limited figure space) and the successive converter stages 24 of the pipelined ADC 20 of FIG. 1 (and its input and output ports 25 and 27). In contrast, however, the ADC 100 replaces the error corrector 26 with first and second error correctors 102 and 104 and a digital filter 106 which is positioned between the two error correctors.

In operation of this structure, the first error corrector 102 receives the digital words from converter stages 2-N and processes them to provide a corrected digital code in a manner similar to that described above with reference to FIG. 2C. In a significant recognition of the present invention, it is recognized that just as the corresponding digital code provided by the second error corrector 104 is a digital representation of the analog input signal to converter stage 1 (i.e., the analog sample provided by the sampler 22), the corrected digital code provided by the first error corrector 102 is a digital representation of the residue signal $S_{res}$ of converter stage 1.

With this recognition, the invention then reduces the memory of converter stage 1 by using the digital filter 106 to filter the corrected digital code to a filtered corrected digital code that is provided to the second error corrector 104 along with the digital word $D_1$ of converter stage 1. The second error corrector processes these signals in a manner similar to that described above with reference to FIG. 2C to thereby provide a corresponding digital code that corresponds to the original analog sample.

In the pipelined ADC 100, the digital filter 106 is a Finite Impulse Response (FIR) filter that includes a signal delay 110, a multiplier 112 and an adder 114. The multiplier is positioned between the delay and the adder and receives a delayed signal from the delay and also receives a memory parameter $\mu_1$. The adder 114 sums the corrected digital code and the output of the multiplier 112 to provide the filtered corrected digital code. The delay 110 provides the preceding corrected digital code and the multiplier modifies this digital code in accordance with the memory parameter $\mu_1$. The product of the multiplier then substantially removes the memory effect of the current corrected digital code from the first error corrector 102. The first error corrector 102 and the digital filter 106 thus form a residue calibrator 108 that calibrates the residue signal of converter stage 1.

If a known signal were applied to converter stage 1 in one converter cycle and a zero signal applied in a succeeding converter cycle, a nonzero output signal in the succeeding cycle forms a measure of the memory parameter $\mu_1$. That is, the applied zero signal should have resulted in a zero output signal and the magnitude of the nonzero output signal is a measure of the memory parameter $\mu_1$ that induced the nonzero signal. For example, if the zero signal is then replaced with a replacement signal that reduces the output signal in the succeeding cycle to zero, the ratio of the replacement signal to the known signal is the desired memory parameter $\mu_1$. To reduce the effect of offset errors in converter stage 1, this procedure can be repeated with a different known signal and the difference in the measurements taken as the memory parameter $\mu_1$.

In an exemplary method of measuring the memory parameter $\mu_1$, converter stage 1 is provided with a second test set of the first and second capacitors $C_1$ and $C_2$ of FIG. 2A. During the second operational phase 50B of FIG. 2A, the test set is arranged to receive an electrical charge from the known signal (in a manner similar to the reception of the electrical charge 54 in the first and second capacitors in the first operational phase 50A).

During the succeeding first operational phase 50A of FIG. 2A, the test set is arranged about the amplifier 44 to transfer an electrical charge to the second capacitor of the test set (in a manner similar to transfer of the electrical charge 56 during the second operational phase 50B). The memory parameter $\mu_1$ is the ratio of the resultant signal at the converter stage's output to the known signal.

Alternatively, an unused copy of the converter stage 1 could be provided for measurement of the memory parameter $\mu_1$. In this case, the measurement would not have to be interleaved with the operational phases of converter stage 1.

In another exemplary method of measuring the memory parameter $\mu_1$, two uncorrelated sequences of input signals are applied to converter stage 1 in an interleaved arrangement and the correlation of the stage's output measured at the output of the digital filter 106 of FIG. 3A. The stage's memory effect will induce correlation in the output signals of the interleaved sequences. The memory parameter $\mu_1$ is a signal applied to the digital filter 106 that reduces the correlation to zero. The memory parameter can be updated to the correct value with an adaptive algorithm (e.g., a least mean squares (LMS) algorithm) that minimizes the correlation. The signal sequences can be applied to a test set of capacitors or to an unused copy of the converter stage 1 as previously described.

Figure 3B:
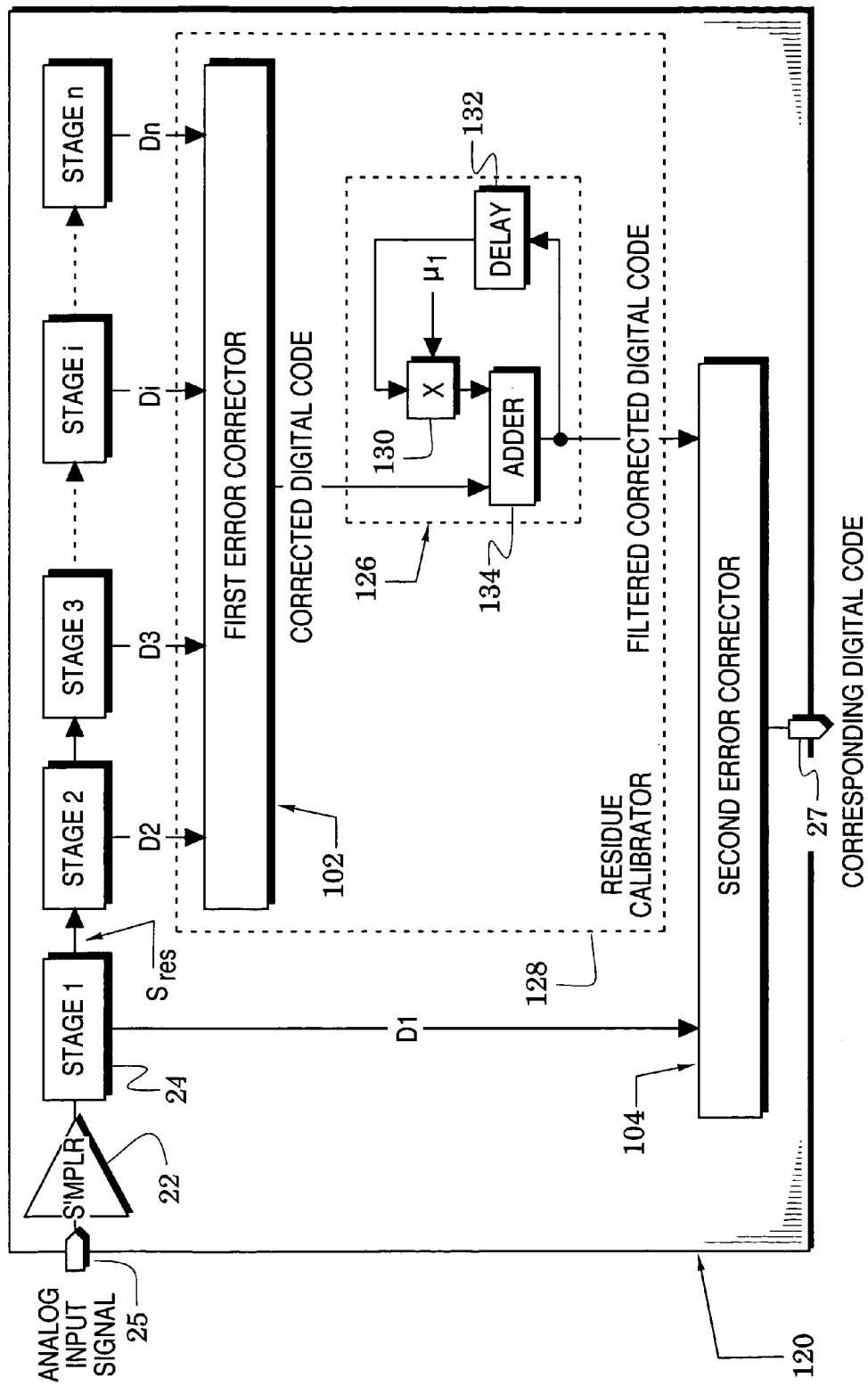

Another pipelined ADC 120 is shown in FIG. 3B. This ADC is similar to the ADC 100 of FIG. 3A with like elements indicated by like reference numbers. In contrast, however, the FIR filter 106 of FIG. 3A is replaced with an Infinite Impulse Response (IIR) filter 126 that includes a signal delay 130, a multiplier 132 and an adder 134. The delay is coupled to the output of the adder and the multiplier is arranged to couple the output of the delay to one input of the adder. The corrected digital code of the first error corrector forms the other input of the adder. The first error corrector 102 and the digital filter 126 thus form a residue calibrator 128 that calibrates the residue signal of converter stage 1.

In the FIR filter 106 of FIG. 3A, its present output is a function of its past input. The IIR filter 126 has a recursive effect because of delayed signal feedback through the delay 132. Accordingly, its present output is a function of its past output. Although the FIR filter lacks this recursive effect, it is generally more stable.

The FIR filter 106 of FIG. 3A multiplies the preceding corrected digital code by a memory parameter $\mu_1$ and adds this product to the current corrected digital code to thereby reduce memory effects in the current residue signal of converter stage 1 that were induced by the preceding residue signal. In other embodiments of the invention, it may be desirable to reduce the memory effects in the current corrected digital code that were induced by even earlier residue signals.

Figures 4A, 4B:
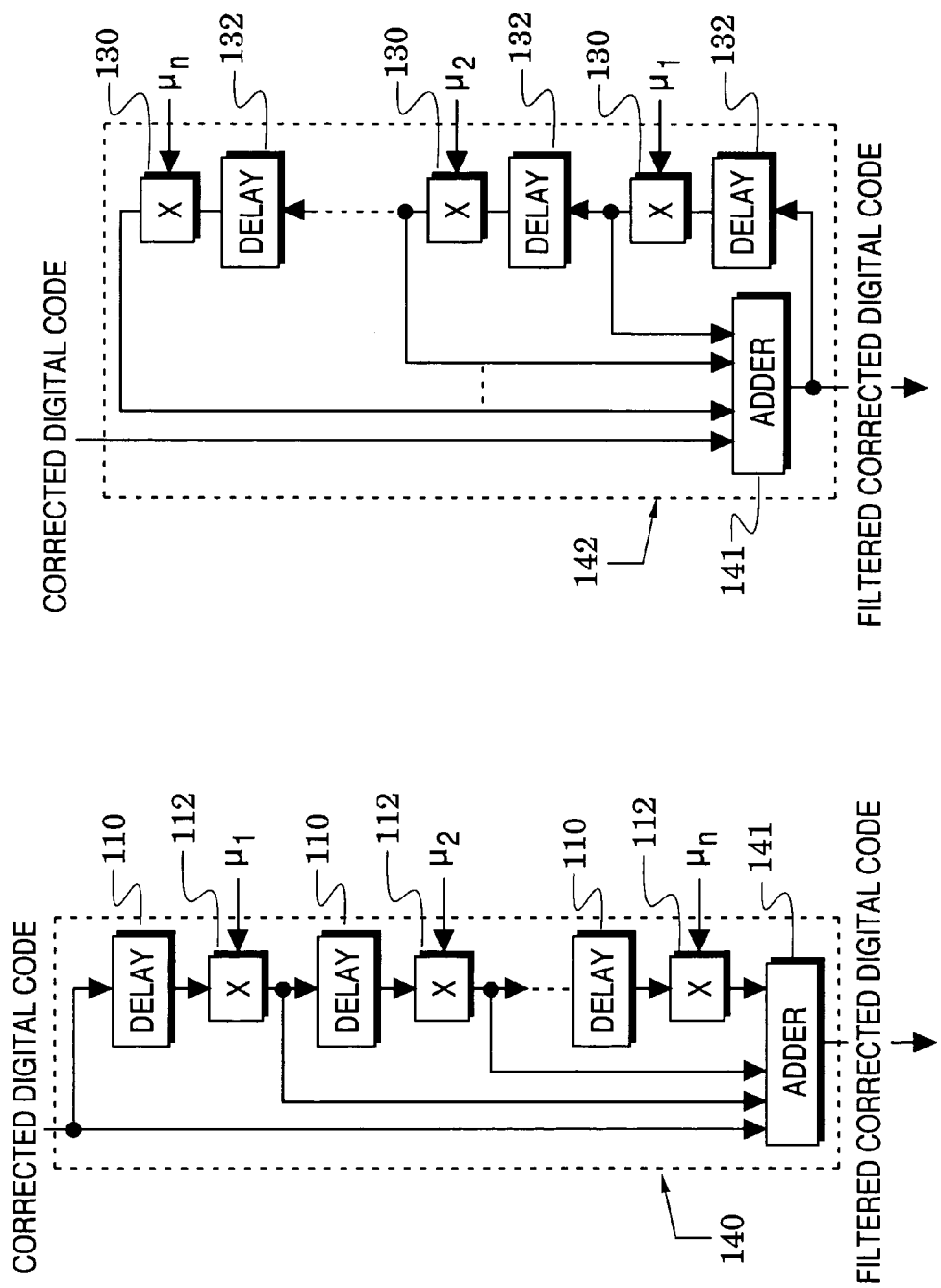
FIGS. 4A and 4B are block diagrams of digital filters for respective use in the pipelined ADC systems of FIGS. 3A and 3B to reduce memory effects induced in a converter stage by successively preceding output signals.

Accordingly, FIG. 4A illustrates an FIR digital filter 140 that can replace the FIR digital filter 106 in FIG. BA. The filter 140 replaces the adder 114 of the filter 106 with a multiport adder 141 and inserts additional sets of signal delays 110 and multipliers 112 ahead of the set shown in the filter 106. The output of each multiplier is then coupled to a respective port of the multiport adder. Successively older residue signals are provided by the delays and the multipliers multiply these by corresponding memory constants $\mu_1$, $\mu_2$, ... $\mu_n$. The adder 141 sums the products with the current digital representation of the residue signal to thereby reduces memory effects that were induced by n successively older residue signals.

Similarly, FIG. 4B illustrates an IIR digital filter 142 that can replace the IIR digital filter 126 in FIG. 3B. The filter 142 uses the multiport adder 141 and inserts additional sets of signal delays 110 and multipliers 112 after the set shown in the filter 126. The output of each multiplier is then coupled to a respective port of the multiport adder. Successively older signals from the adder are provided by the delays and the multipliers multiply these by corresponding memory constants $\mu_1, \mu_2, \ldots \mu_n$. The action of the adder 142 then reduces memory effects in the digital representation of the current residue signal of converter stage 1 that were induced by n successively older residue signals but does it in a recursive fashion.

As stated above, the FIR filter 106 of FIG. 3A multiplies the preceding corrected digital code by a memory parameter $\mu_1$ and adds this product to the current corrected digital code to thereby reduce memory effects in the current residue signal of converter stage 1 that were induced by the preceding residue signal. In other embodiments of the invention, it may be desirable to reduce memory effects in the current corrected digital code that were induced by the preceding residue signal of converter stage 1 and the preceding input signal of converter stage 1, i.e., the preceding signal provided by the sampler 22.

Figure 5A:
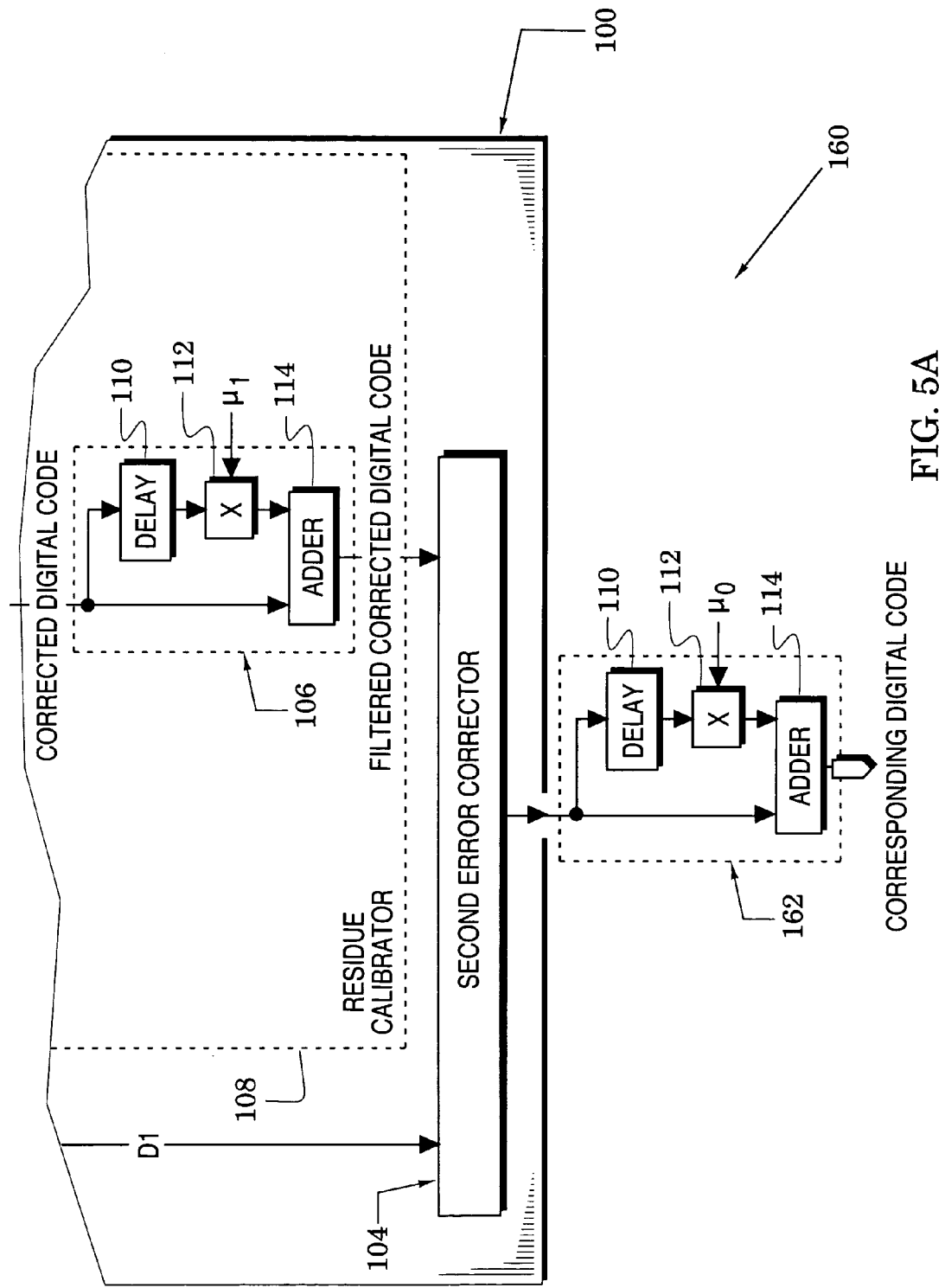
FIGS. 5A and 5B are block diagrams of pipelined ADC system embodiments of the present invention that reduce memory effects induced by a previous input signal and a previous output signal of a converter stage.

As recognized above, the corresponding digital code provided by the second error corrector 104 of FIG. 3A is a digital representation of the analog input signal at the input port 25. Accordingly, FIG. 5A illustrates a pipelined ADC 160 that supplements the pipelined ADC 100 of FIG. 3A with a second FIR filter 162 that has the elements and arrangements of the filter 106 in FIG. 3A. The second FIR filter 162 is positioned to process the output of the second error corrector 104 in accordance with a corresponding memory constant $\mu_0$.

In operation, the second error corrector 104 provides a digital representation of the current analog input signal to converter stage 1 while the delay 110 of the second FIR filter 162 provides a digital representation of the previous analog input signal to converter stage 1. The multiplier 112 multiplies the digital representation of the previous analog input signal by the memory constant $\mu_0$ and this product is summed with the digital representation of the current analog input signal in the adder 114 to generate the corresponding digital code. The pipelined ADC 160 thus reduces memory effects in the residue signal of converter stage 1 that were induced by both of the preceding output signal and the preceding input signal of converter stage 1.

Figure 5B:
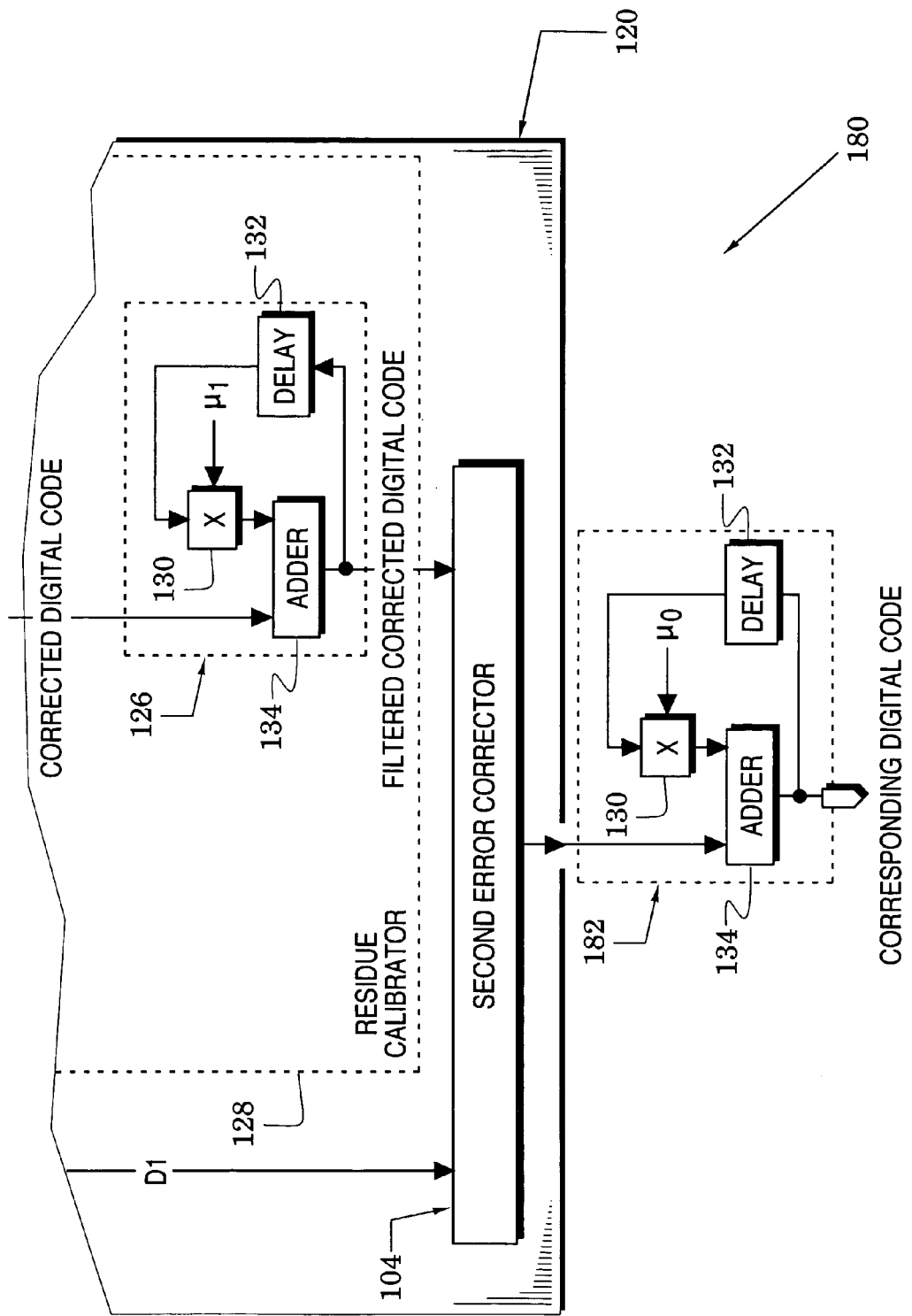

Similarly, FIG. 5B illustrates a pipelined ADC 180 that supplements the pipelined ADC 120 of FIG. 3B with a second IIR filter 182 that has the elements and arrangements of the IIR filter 126 in FIG. 3B except that the IIR filter processes with a corresponding memory constant $\mu_0$. Operation of the pipelined ADC 180 is similar to that of the pipelined ADC 160 of FIG. 5A so that memory effects induced by the preceding output signal and the preceding input signal of converter stage 1 are reduced. The IIR filter 182, however has a recursive effect because of delayed signal feedback through its delay 132. Accordingly, its present output is a function of its past output.

Figure 6:
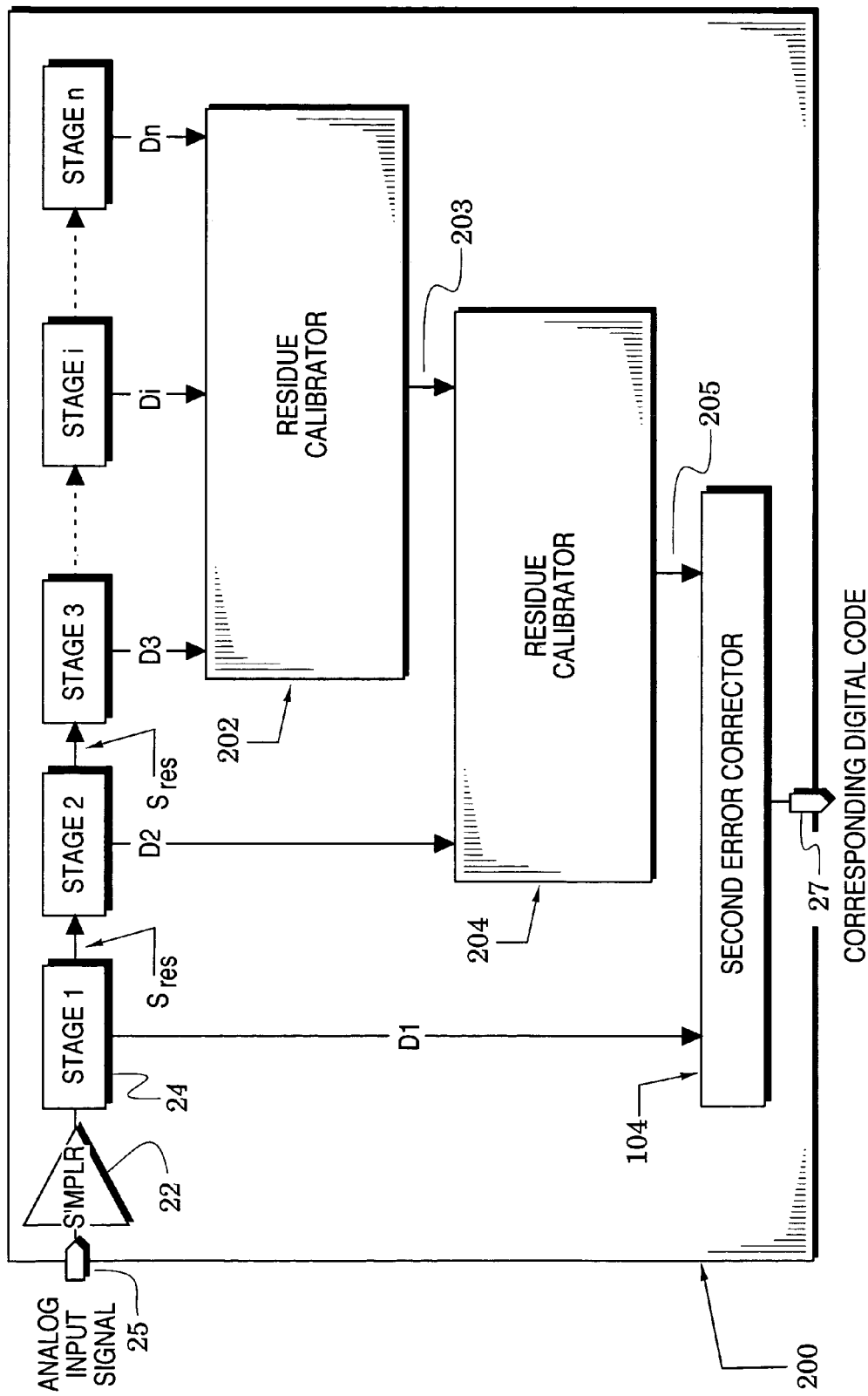
FIG. 6 is a block diagram of a pipelined ADC system embodiments of the present invention that reduces memory effects induced by preceding output signals of two converter stages.

The residue calibrator 108 of FIG. 3A processes the digital representation of the residue signal $S_{res}$ of converter stage 1 to provide a filtered corrected digital code in which the memory effects of a preceding output signal (a preceding residue signal) have been reduced. Although memory effect errors of converter stage 1 dominate similar errors in downstream converter stages, it may be advantageous to extend the processing of FIG. 3A to one or more of the downstream stages. This is exemplified in the pipelined ADC 200 of FIG. 6 which is similar to the pipelined ADC 100 of FIG. 3 with like elements indicated by like reference numbers.

The ADC 200, however, replaces the residue calibrator 108 of FIG. 3A with two residue calibrators 202 and 204. The first residue calibrator 202 receives digital words of converter stages 3-N and, in response, provides a filtered corrected digital code 203 which is the filtered digital representation of the residue signal $S_{res}$ of converter stage 2. As described above, the first residue calibrator 202 reduces memory effects in this residue signal that were induced by the preceding residue signal of converter stage 2.

The second residue calibrator 204 receives digital words of converter stage 1 and the filtered corrected digital code 203 of the first residue calibrator 202. In response, second residue calibrator 204 provides a filtered corrected digital code 205 which is the filtered digital representation of the residue signal $S_{res}$ of converter stage 1. Accordingly, the second residue calibrator 204 reduces memory effects in this residue signal that were induced by the preceding residue signal of converter stage 1. The structure exemplified by the ADC 200 can be extended in a similar manner to reduce memory effects in other succeeding converter stages.

Figure 7A:
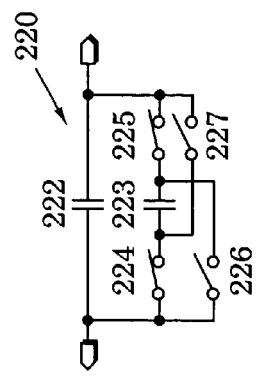
FIG. 7 is a schematic diagram that illustrates operational phases in a switched-capacitor embodiment of the present invention for use in the system of FIG. 1A.

ADC structures have been described above that reduce memory effects of converter stages with digital processing. FIGS. 7A, 7B, 8A and 8B show embodiments of the invention that reduce the memory effects with switched-capacitor structures. In particular, FIG. 7A illustrates a replacement structure 220 for MDACs of the ADC system 20 of FIG. 1. The structure would replace, for example, each of the first and second capacitors $C_1$ and $C_2$ in the MDAC 48 of FIG. 2A.

Figure 7B:
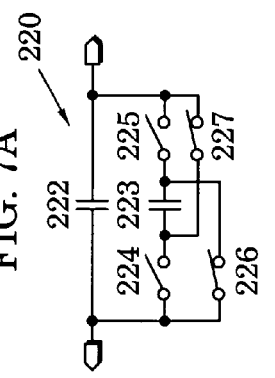

The switched-capacitor structure 220 has two sub-capacitors 222 and 223 that each have ½ the capacitance of each of the capacitors $C_1$ and $C_2$. In FIG. 7A, sub-capacitor 223 is coupled by switches 224 and 225 in a first orientation with sub-capacitor 222. In FIG. 7B, switches 224 and 225 are opened and previously-open switches 226 and 227 are closed to couple sub-capacitor 223 in a second orientation with sub-capacitor 222 that is reversed from the first orientation of FIG. 7A.

In operation of the MDAC 40 of FIG. 2A, the first and second operational phases 50A and 50B of one converter cycle would be conducted with each of the first and second capacitors $C_1$ and $C_2$ configured as in FIG. 7A. The first and second operational phases 50A and 50B of a succeeding converter cycle would be conducted with each of the first and second capacitors $C_1$ and $C_2$ configured as in FIG. 7B. The memory effect of sub-capacitor 223 would substantially cancel the memory effect of sub-capacitor 222. In each converter cycle, the switched-capacitor structure 220 would thus substantially cancel any memory effect errors induced in the preceding converter cycle.

Figure 8A:
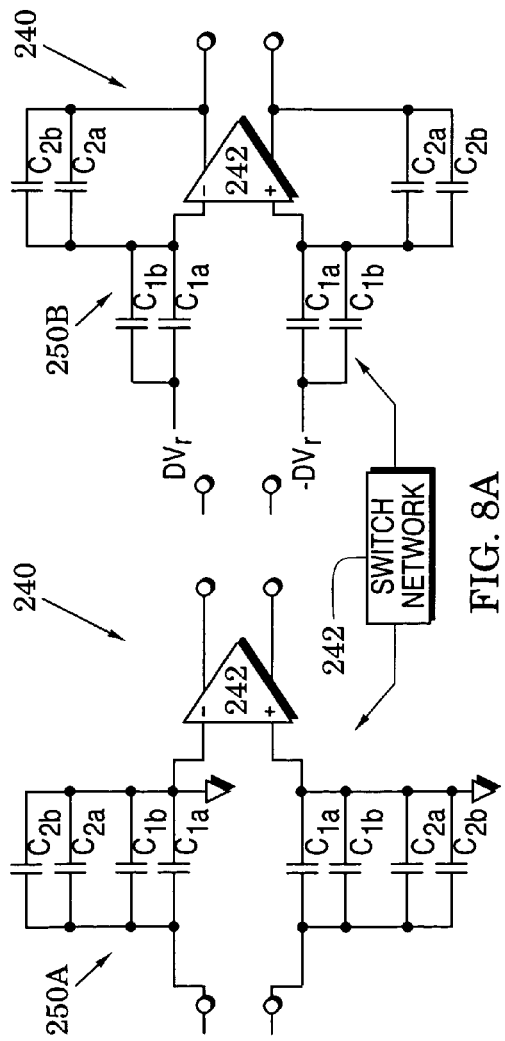
FIGS. 8A and 8B are schematic diagrams that illustrate operational phases in another switched-capacitor embodiment of the present invention.

FIG. 8A illustrates a switched-capacitor MDAC 240 which is a differential version of the switched-capacitor MDAC 48 of FIG. 2A. It replaces the amplifier 44 of FIG. 2A with a differential amplifier 242 and provides each differential input of this amplifier with the first and second capacitors $C_1$ and $C_2$ of FIG. 2A except that each capacitor is configured as two sub-capacitors with substantially ½ the capacitance. For example, the upper input of the differential amplifier 242 has sub-capacitors $C_{1a}$ and $C_{1b}$ which together provide the capacitance of the first capacitor $C_1$ of FIG. 2A.

Figure 8B:
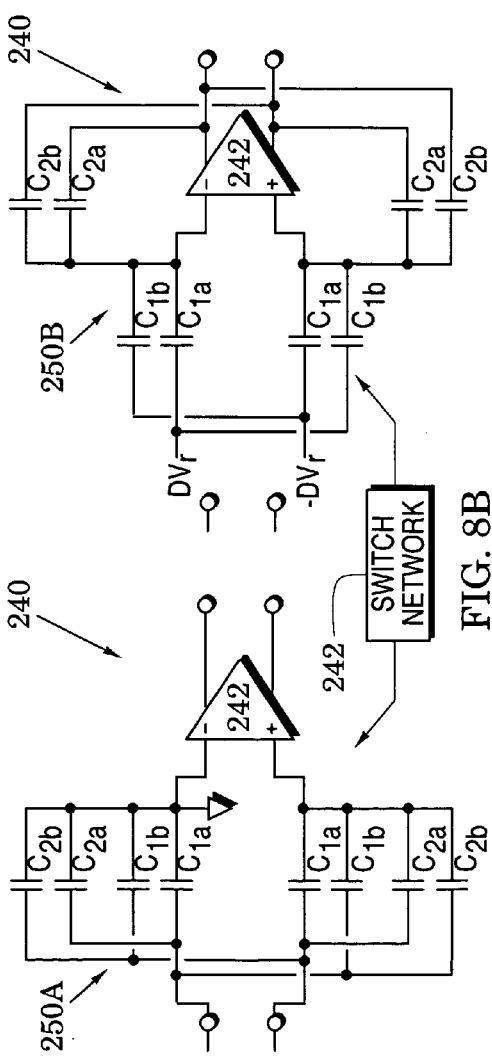

FIG. 8A shows the switched-capacitor MDAC 240 arranged for first and second operational phases 250A and 250B of one converter cycle. These operational phases correspond to the operational phases 50A and 50B of FIG. 2A. FIG. 8B shows the switched-capacitor MDAC 240 arranged for first and second operational phases 250A and 250B of a succeeding converter cycle. A switch system 242 couples the sub-capacitors in one arrangement in FIG. 8A and in a different arrangement in FIG. 8B. A variety of conventional switch systems can be used to realize the arrangements of FIGS. 8A and 8B. Accordingly, the switch system is shown generically which also clarifies the arrangements.

With attention directed to the sub-capacitors $C_{1a}$ and $C_{1b}$, it is noted in FIG. 8A that sub-capacitor $C_{1a}$ receives and transfers charges in the first and second operational phases 250A and 250B in a manner similar to the receiving and transferring of charges in first and second operational phases 50A and 50B of FIG. 2A. It is further noted that these operations are in association with a respective differential side (the upper side) of the differential amplifier 242 in both the converter cycle of FIG. 8A and the succeeding converter cycle of FIG. 8B.

It is noted in FIGS. 8A and 8B that sub-capacitor $C_{1b}$ also receives and transfers charges in the first and second operational phases 250A and 250B in a manner similar to the receiving and transferring of charges in first and second operational phases 50A and 50B of FIG. 2A. In the converter cycle of FIG. 8A, it is further noted that these operations are in association with the respective differential side of sub-capacitor $C_{1a}$ (the upper side). In the converter cycle of FIG. 8B, however, it is noted that these operations are in association with the other differential side the differential amplifier 242 (the lower side).

In general, therefore, each of the capacitors of the switched-capacitor MDAC 240 are formed with first and second sub-capacitors. The first sub-capacitor receives and transfers charges in association with a respective differential side of the differential amplifier 242 in successive converter cycles. In contrast, the second sub-capacitor receives and transfers charges in association with the differential side of the first sub-capacitor in one converter cycle and in association with the other differential side in a succeeding converter cycle. In one converter cycle, the second sub-capacitor thus substantially cancels the memory effect errors induced in the preceding converter cycle.

Simulations were used to evaluate a 14-bit, 200 megasample/second ADC and a 16-bit, 100 megasample/second ADC that were configured similar to the ACD 100 of FIG. 3A. That is, the residue of converter stage 1 was calibrated with a single memory parameter $\mu_1$. When the 14-bit ADC was simulated with silicon nitride capacitors having a material constant $\kappa$ of 3000 ppm, it had a signal-to-noise ratio (SNR) of 69 dB and a spurious free dynamic range (SFDR) of 75 dB without calibration and an SNR of 79.5 dB and a SFDR of 103 dB with calibration. The 14-bit ADC was then simulated with silicon nitride capacitors having a material constant $\kappa$ of 5000 ppm and it exhibited an integral nonlinearity (INL) of 6 LSBs without calibration and an INL of 0.8 LSB with calibration.

When the 16-bit ADC (4-bit first stage) was simulated with silicon nitride capacitors having a material constant $\kappa$ of 3000 ppm, it had SNR of 70 dB and a SFDR of 77 dB without calibration and an SNR of 88 dB and a SFDR of 104 dB with calibration. The 16-bit ADC was then simulated with silicon nitride capacitors having a material constant $\kappa$ of 300 ppm and it exhibited an SNR of 87 dB and a SFDR of 96 dB without calibration and an SNR of 90.5 dB and a SFDR of 110.5 dB with calibration.

In different realizations of the invention, many of its converter structures may be configured with arrays of logic gates, with appropriately-programmed digital processors and with combinations thereof.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of reducing memory effects while processing an analog input signal to a corresponding digital code, comprising the steps of:
   converting said analog signal to a corresponding digital code in successive converter cycles;
   in at least one of said cycles, generating a residue signal with at least one capacitor that comprises sub-capacitors, and
   reversing one of said sub-capacitors in selected ones of said cycles to thereby reduce memory effects of said generating step.

2. The method of claim 1, wherein said sub-capacitors are low pressure chemical vapor deposition oxide capacitors.

3. An analog-to-digital converter that processes an analog input signal to a corresponding digital code with reduced memory effects, the converter comprising:
   a plurality of converter stages that convert an analog signal to a corresponding digital signal in successive converter cycles wherein at least one stage generates a residue signal with a switched-capacitor network in which at least one capacitor comprises:
   two parallel-coupled sub-capacitors; and
   a switch network arranged to reverse one of said sub-capacitors in selected ones of said cycles.

4. The converter of claim 3, wherein said sub-capacitors have substantially equal capacitance.

5. The converter of claim 3, wherein selected cycles are alternate cycles.

6. The converter of claim 3, wherein said switch network includes:
   first and second switches that couple a first one of said sub-capacitors about a second one of sub-capacitors in a first orientation; and
   third and fourth switches that couple said first sub-capacitor about said second sub-capacitor in a second reversed orientation.

7. The converter of claim 3, wherein said sub-capacitors are low pressure chemical vapor disposition oxide capacitors.

8. The converter of claim 3, wherein each capacitor of said stage comprises two parallel-coupled sub-capacitors and a switch network that is arranged to reverse one of said sub-capacitors in selected ones of said cycles.

9. The converter of claim 3, wherein said converter stages are pipelined converter stages and said switch network comprises a switched-capacitor multiplying digital-to-analog converter.

10. A method of reducing memory effects while processing an analog input signal to a corresponding digital code, comprising the steps of:
    converting said analog signal to a corresponding digital code in successive converter cycles;
    in at least one of said cycles, generating a residue signal with a differential switched-capacitor network that receives and transfers charges wherein at least one capacitor of said network comprises a first sub-capacitor and a second sub-capacitor;
    with said first sub-capacitor, receiving and transferring charges in association with a respective differential side of said differential network; and
    with said second sub-capacitor, receiving and transferring charges in association with the differential side of said first sub-capacitor in selected ones of said cycles and in association with the other differential side in other ones of said cycles.

11. An analog-to-digital converter, comprising:

a plurality of converter stages that convert an analog signal to a corresponding digital signal in successive converter cycles wherein at least one stage includes a differential switched-capacitor network that receives and transfers charges to generate a residue signal wherein:

each capacitor is formed with a first sub-capacitor and a second sub-capacitor;

said first sub-capacitor is part of a first set of said capacitors that receive and transfer charges in association with a respective differential side of said differential network; and said second sub-capacitor is part of a second set of said capacitors that receive and transfer charges in association with the differential side of said first sub-capacitor in selected ones of said cycles and receive and transfer charges in association with other differential side in other ones of said cycles.

12. The converter of claim 11, further including a switch network that couples said second sub-capacitor to the differential side of said first sub-capacitor in selected ones of said cycles and couples said second sub-capacitor to the other differential side in other ones of said cycles.

13. The converter of claim 11, wherein said first and second sub-capacitors have substantially equal capacitance.

14. The converter of claim 11, wherein said other cycles are successive cycles.

15. The converter of claim 11, wherein said converter stages are pipelined converter stages and said switched-capacitor network comprises a switched-capacitor multiplying digital-to-analog converter.

* * * * *